United States Patent
Chen et al.

(10) Patent No.: US 9,853,082 B2
(45) Date of Patent: Dec. 26, 2017

(54) COLOR FILTER ARRAY AND MICRO-LENS STRUCTURE FOR IMAGING SYSTEM

(71) Applicant: Taiwan Semiconductor Manufacturing Co., Ltd., Hsin-Chu (TW)

(72) Inventors: Szu-Ying Chen, Toufen Township (TW); Dun-Nian Yaung, Taipei (TW); Chen-Jong Wang, Hsin-Chu (TW); Tzu-Hsuan Hsu, Kaohsiung (TW)

(73) Assignee: Taiwan Semiconductor Manufacturing Co., Ltd., Hsin-Chu (TW)

( * ) Notice: Subject to any disclaimer, the term of this patent is extended or adjusted under 35 U.S.C. 154(b) by 0 days.

(21) Appl. No.: 15/144,998

(22) Filed: May 3, 2016

(65) Prior Publication Data
US 2016/0247854 A1    Aug. 25, 2016

Related U.S. Application Data (62) Division of application No. 14/084,758, filed on Nov. 20, 2013, now abandoned.

(51) Int. Cl.
*H01L 27/146* (2006.01)

(52) U.S. Cl.
CPC .. *H01L 27/14685* (2013.01); *H01L 27/14621* (2013.01); *H01L 27/14627* (2013.01); *H01L 27/14689* (2013.01); *H01L 27/14643* (2013.01)

(58) Field of Classification Search
CPC ......... H01L 27/14621; H01L 27/14627; H01L 27/14685
See application file for complete search history.

(56) References Cited

U.S. PATENT DOCUMENTS

| | | | |
|---|---|---|---|
| 8,455,971 B2 | 6/2013 | Chen et al. | |
| 8,710,563 B2 | 4/2014 | Yun et al. | |
| 2005/0199898 A1* | 9/2005 | Lin | H01L 33/20 257/98 |
| 2008/0290383 A1* | 11/2008 | Dunne | G02B 3/0018 257/292 |
| 2008/0303107 A1 | 12/2008 | Minamio et al. | |
| 2009/0061556 A1* | 3/2009 | Ryu | H01L 27/14621 438/70 |
| 2009/0315131 A1 | 12/2009 | Hung et al. | |
| 2010/0245638 A1* | 9/2010 | Ota | H01L 27/14621 348/280 |

(Continued)

FOREIGN PATENT DOCUMENTS

JP    3158446    * 2/2001    ............. H01L 27/14

OTHER PUBLICATIONS

English translation of Nobuhisa (JP 3158446) provided by AIPN, Feb. 16, 2001.*

(Continued)

*Primary Examiner* — Stephen Bradley
(74) *Attorney, Agent, or Firm* — Eschweiler & Potashnik, LLC (57) ABSTRACT

A color filter array and micro-lens structure for imaging system and method of forming the color filter array and micro-lens structure. A micro-lens material is used to fill the space between the color filters to re-direct incident radiation, and form a convex micro-lens structure above a top surface of the color filters.

20 Claims, 6 Drawing Sheets

(56) References Cited

U.S. PATENT DOCUMENTS

| | | | |
|---|---|---|---|
| 2010/0309349 A1 | 12/2010 | Kozlowski | |
| 2012/0104525 A1* | 5/2012 | Wu | G02B 3/0018 |
| | | | 257/432 |
| 2012/0140332 A1 | 6/2012 | Yun et al. | |
| 2012/0273906 A1* | 11/2012 | Mackey | H01L 27/14605 |
| | | | 257/432 |
| 2013/0188257 A1 | 7/2013 | Cho et al. | |
| 2013/0242149 A1* | 9/2013 | Terai | H01L 27/14621 |
| | | | 348/280 |
| 2013/0293751 A1 | 11/2013 | Vaartstra et al. | |
| 2015/0041937 A1* | 2/2015 | Yu | H01L 27/14621 |
| | | | 257/432 |
| 2015/0091115 A1 | 4/2015 | Lin et al. | |

OTHER PUBLICATIONS

Juha Alakarhu; "Image Sensors and Image Quality in Mobile Phone"; Nokia, Technology Platforms, Camera Entity, Nov. 19, 2013, p. 1-4.

Non-Final Office Action dated Jul. 1, 2015 for U.S. Appl. No. 14/084,758.

Final Office Action dated Dec. 16, 2015 for U.S. Appl. No. 14/084,758.

\* cited by examiner

COLOR FILTER ARRAY AND MICRO-LENS STRUCTURE FOR IMAGING SYSTEM

REFERENCE TO RELATED APPLICATION

This Application is a Divisional of U.S. application Ser. No. 14/084,758 filed on Nov. 20, 2013, the contents of which is incorporated by reference in its entirety.

BACKGROUND

Digital cameras and other digital imaging devices use arrays of millions of tiny photodetectors or pixels to record an image. For example, when a cameraman or camerawoman presses his or her camera's shutter button and exposure begins, each photodetector in the array is uncovered to detect the presence or absence of photons at the individual array locations. To end the exposure, the camera closes its shutter, and circuitry in the camera assesses how much light (e.g., how many photons) fell into each photodetector while the shutter was open. The relative quantity or intensity of photons that struck each photodetector are then stored according to a bit depth (0-255 for an 8-bit pixel). The digital values for all the pixels are then stored and are used to form a resultant image.

DETAILED DESCRIPTION

The description herein is made with reference to the drawings, wherein like reference numerals are generally utilized to refer to like elements throughout, and wherein the various structures are not necessarily drawn to scale. In the following description, for purposes of explanation, numerous specific details are set forth in order to facilitate understanding. It will be appreciated that the details of the figures are not intended to limit the disclosure, but rather are non-limiting embodiments. For example, it may be evident, however, to one of ordinary skill in the art, that one or more aspects described herein may be practiced with a lesser degree of these specific details. In other instances, known structures and devices are shown in block diagram form to facilitate understanding.

Individual photodetectors are often, in-and-of themselves, unable to differentiate between different colors of light. Therefore a color filter array (CFA) with color filter elements for different colors is often aligned over a photodetector array so that photodetectors detect light intensity of different colors. Traditionally, indexes of refraction of the different color filter elements are similar, such that when an incident light ray has a large angle of incidence, the light could easily pass through one color filter into other neighboring color filters and/or other neighboring photodetectors underneath the color filters. In this way, crosstalk can happen between photodetectors for different color filters, ultimately causing noise that distorts the resultant digital images.

In general, the present disclosure is related to an optimized semiconductor color filter array and micro-lens structure that alleviates crosstalk between neighboring photodetectors underlying different color filters. These disclosed techniques improve signal-to-noise ratios (SNR) for imaging systems. More particularly, a sidewall waveguide structure is formed between neighboring color filter elements and works in conjuction with a color filter element and a micro-lens structure to limit crosstalk. In some embodiments, the sidewall waveguide structure and micro-lens structure can be made of the same material to limit the number of manufacturing steps. In some embodiments, when incident radiation reaches a waveguide structure between two neighboring color filter elements, the waveguide re-directs the incident radiation back to one of the color filter elements and away from the other color filter element. With some incident angles, for example, total internal reflection happens at the contact surface of the color filter element and the sidewall waveguide structure, which prevents light from passing through neighboring color filter elements. With other incident angles, for example, the sidewall waveguide structure refracts light between neighboring photodetector elements so the light does not inadvertently strike a neighboring photodetector. As a result, larger portion of the incident radiance strikes a photodiode underneath its corresponding color filter element and less light "strays" to neighboring photodiodes, such that SNR is improved.

Figure 1:
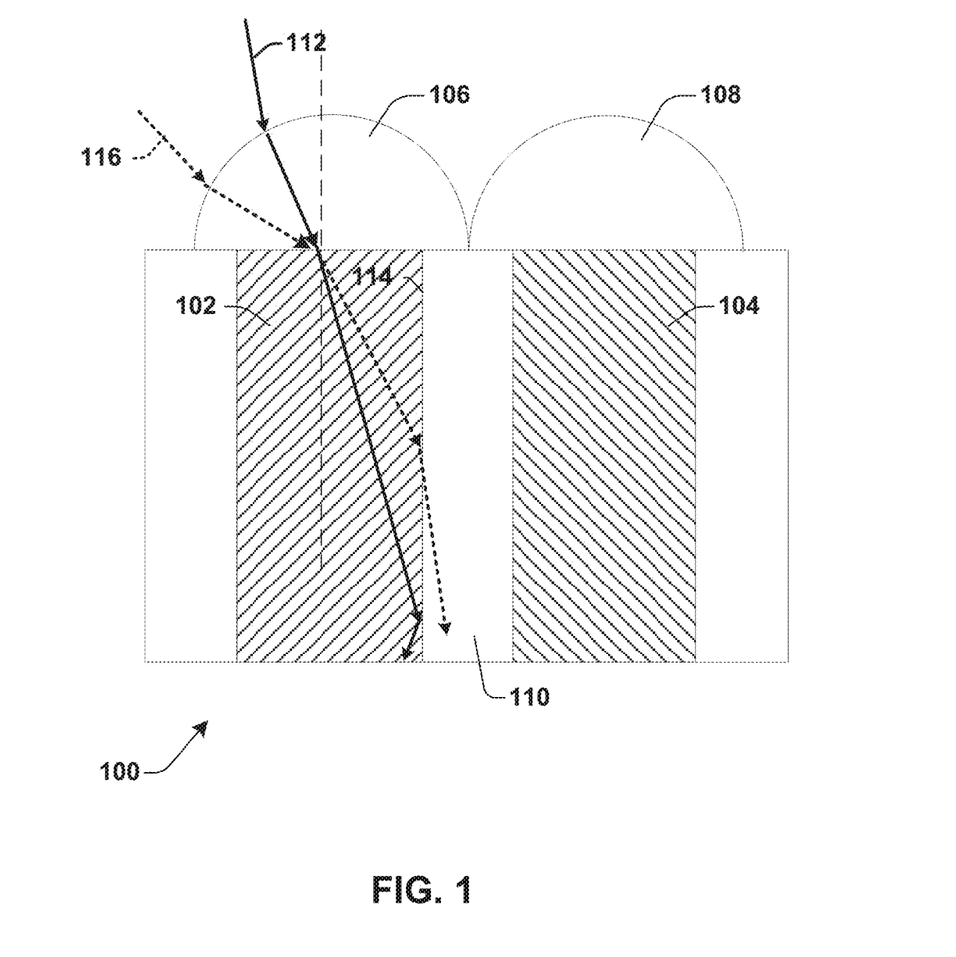
FIG. 1 illustrates a cross-sectional view of a color filter array and micro-lens structure for imaging system in accordance with some embodiments.

FIG. 1 illustrates a cross-sectional view of some embodiments of an example semiconductor substrate 100 upon which a semiconductor color filter array and micro-lens structure for imaging system has been applied. Substrate 100 includes a first color filter element 102 and a second color filter element 104, which are different. For example, in some embodiments, first color filter element 102 is a blue filter, which allows blue light to pass there through while blocking other wavelengths of light (e.g., blue filter 102 blocks red and green light), and second color filter element 104 can be a green filter, which allows green light to pass there through while blocking other wavelengths of light (e.g. green filter 104 blocks red and blue light). The color filter elements 102, 104 can have different sizes, spacings or materials to provide the desired wavelength specificities. The color filter elements 102 and 104 may be made of a kind of photo resist which has similar index of refraction ($n_{cf}$), for example between 1.6 and 2.0. A first micro-lens structure 106 is arranged over a top surface of the first color filter element 102; and a second micro-lens structure 108 is arranged over a top surface of the second color filter element 104. A space 110 between the color filter elements 102 and 104 is filled with the same material used to form the first and second micro-lens structures 106, 108. When filled with this material, the space 110 acts as a sidewall waveguide structure that allows both reflectance and refraction of incident radiance.

When incident radiance (see e.g., incident rays 112, 116) strikes this structure, the incident radiance is focused by a micro-lens structure towards its corresponding color filter element, and is re-directed when reaching an internal contact surface 114 at which the color filter element 102 meets the micro-lens material 110. In some embodiments, the micro-lens material 110 could be photo resist or oxide with an index of refraction ($n_r$) smaller than the index of refraction of the color filter elements 102, 104 ($n_{cf}$). In an embodiment, the index of refraction of the micro-lens material is between 1.1 and 1.8. If the incident radiance has an angle of incidence that is less than some critical angle (see incident ray 112), the incident radiance experiences total internal reflectance at the internal contact surface 114 and is therefore bounced back into the color filter element 102. On the other hand, if the incidence radiance has an angle of incidence that is larger than the critical angle (see incident ray 116), the incident radiance is refracted at the internal surface 114 and therefore is re-directed closer to the color filter element 102. In some embodiments, the critical angle for total internal reflection at the internal contact surface 114 can be larger than 30 degrees.

Figure 2:
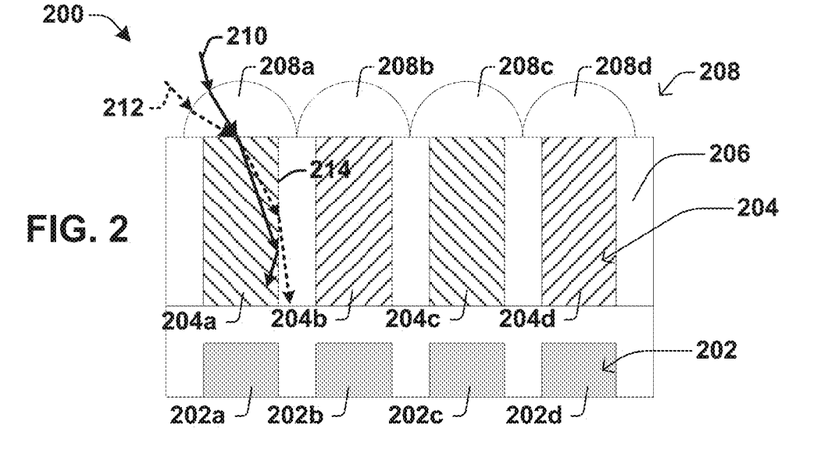
FIG. 2 illustrates a cross-sectional views of some alternative embodiments of a method of forming a color filter array and micro-lens structure for imaging system.

FIG. 2 illustrates a cross-sectional view of some embodiments of an example substrate upon which a semiconductor imaging system 200 has been applied. The imaging system 200 could be a complimentary metal-oxide-semiconductor (CMOS) imaging system. In some embodiments, SNR=10 of the system is less than 115 lux, which represents an improvement of approximately 7%. As appreciated by persons of ordinary skill in the art, the luminance where a given target SNR is reached is used as a one-number performance metric. SNR=10 is a commonly used target SNR.

An array of photodetectors 202, which is made up of individual photodetectors (e.g., 202a, 202b, 202c, 202d), is arranged as a matrix of pixels to collect incident radiance coming through an array of color filter elements 204, which is made up of individual color filter elements (e.g., 204a, 204b, 204c, 204d). As shown, the individual color filter elements are vertically aligned with the individual photodetectors. The color filter array 204 comprises color filter elements for different colors. It could comprise primary color filter elements arranged in a matrix. For example, first color filter element 204a could be a blue filter and second color filter element 204b could be a green filter. Sidewall waveguide structure 206 is arranged between neighboring color filter elements. Similar as previously described with regards to FIG. 1, when incident radiance (see e.g., incident rays 210, 212) strikes this system 200, the incident radiance is focused or directed by a micro-lens structure (e.g., 208a) towards its corresponding color filter element (e.g., 204a) and its corresponding photodetector (e.g., 202a). If the incident radiance has an angle of incidence that is less than some critical angle (see incident ray 210), the incident radiance experiences total internal reflectance at the internal contact surface 214 and is therefore bounced back into the color filter element 204a and its corresponding photodetector 202a. On the other hand, if the incidence radiance has an angle of incidence that is larger than the critical angle (see incident ray 212), the incident radiance is refracted at the internal surface 114 and therefore still passes into the sidewall waveguide structure 206 and passes between photodetectors 202a, 202b without striking either photodetector 202a, 202b.

Advantageously, in either case of total internal reflection or refraction by the sidewall waveguide structure 206, the sidewall waveguide structure 206 diverts the incident light away from neighboring photodetectors (e.g., away from photodetector 202b). Thus, in cases of total internal reflection such as shown by incident ray 210, the sidewall waveguide structure 206 is helpful in that it improves the collection efficiency of photodetector 202a, but also helps to limit cross-talk experienced by the neighboring photodetector 202b. Further, even in cases of refraction as shown by incident ray 212 which do not necessarily improve the collection efficiency of photodetector 202a, by refracting the incident ray 212 away from the neighboring photodetector 202b, the sidewall waveguide structure 206 still helps to limit cross-talk between neighboring photodetectors.

Figure 3:
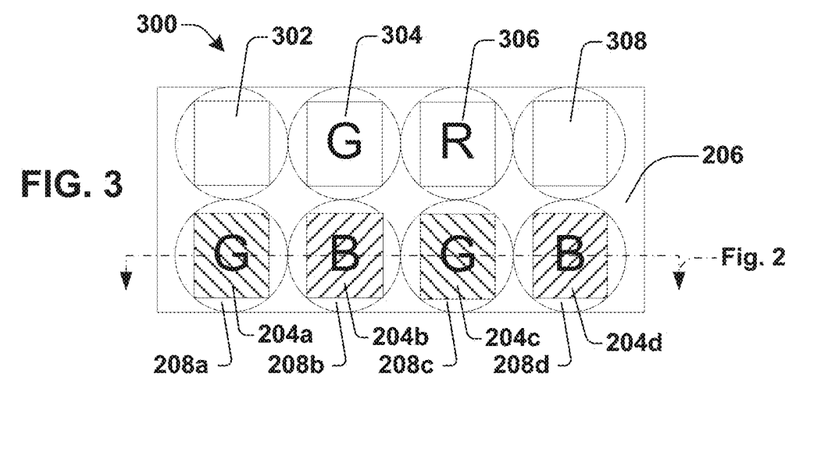
FIG. 3 illustrates a top view of some alternative embodiments of a method of forming a color filter array and micro-lens structure for imaging system and an arrangement method of different color filters.

FIG. 3 shows a top view 300 of one example arrangement of pixels corresponding to the cross-sectional view 200 illustrated in FIG. 2. In this example, color filter elements 204b and 204d are a first type of filter (e.g., blue filters); color filter element 204a is a second, different type of filter (e.g., green filter) and 306 is a third, still different type of filter (e.g., red filter). A space between neighboring color filter elements is formed laterally which is filled by a sidewall waveguide structure 206. The sidewall waveguide structure 206 re-directs incident radiance back toward a color filter element and its vertically aligned or corresponding photodetector. An array of micro-lenses 208 includes individual lenses (e.g., 208a, 208b, 208c, 208d) aligned with the individual color filter elements in the color filter array 204 and the individual photodetectors in the photodetector array 202. Sidewall waveguide structure 206 converges projecting incident radiance.

In an embodiment, in order to have total internal reflection at an internal contact surface at which the sidewall waveguide structure 206 meets a color filter element, a first index of refraction of the sidewall waveguide structure (n1) and a second index of refraction of the micro-lens structure (n2) are smaller than a third index of refraction of the color filter element (n3). In an embodiment, the index of refraction of the sidewall waveguide structure, micro-lens structure, and the color filter element are different. In an embodiment, the material of the photodetector 202 could be or contains silicon. The color filter element 204 could be formed by photo resist with index of refraction n3, which can be between 1.6 and 2.0. The micro-lens structure 208 and the sidewall waveguide structures 206 could be formed by transparent photo resist or oxide. The ratio of a height of color filter element to a space between two adjacent color filter elements (or a distance between at least one of the opposing surfaces of two adjacent color filter elements, e.g. 202a and 202b) could be around 1:7.

Figure 4:
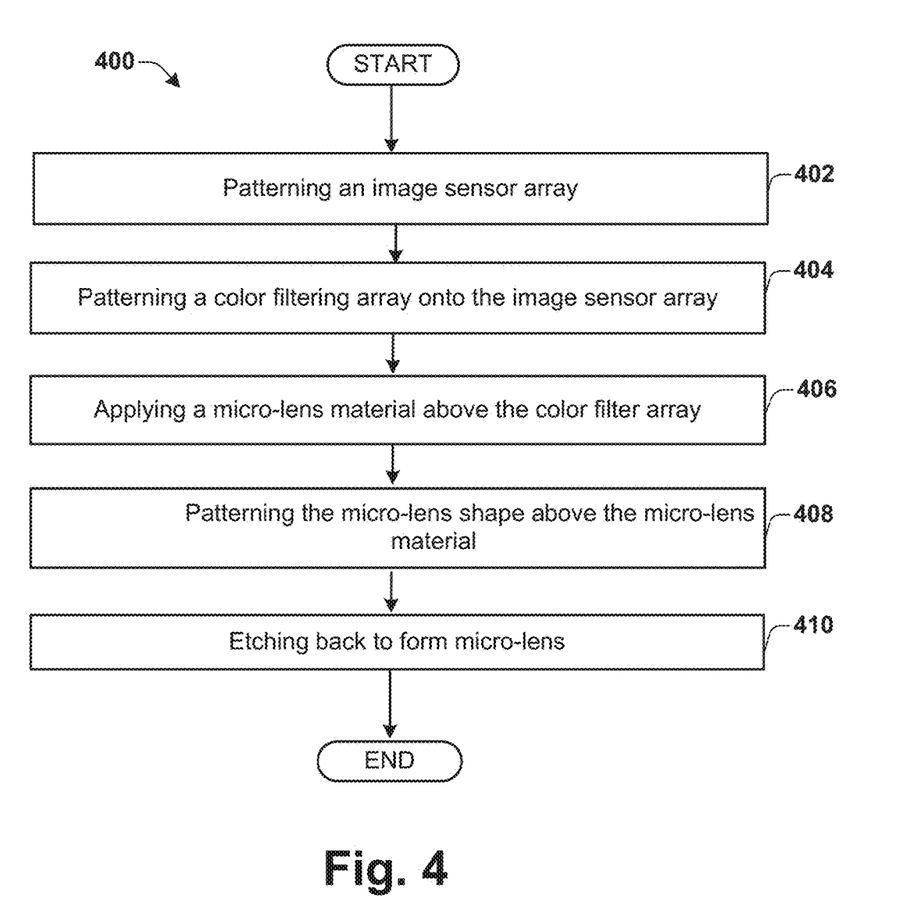
FIG. 4 illustrates a flow diagram of some embodiments of a method for forming a color filter array and micro-lens structure for imaging system.

Further, as will be appreciated in more detail herein, the micro-lens structure 208 and the sidewall waveguide structure 206 could be formed by same manufacturing step and/or made of same material. FIG. 4 illustrates a flow diagram of some example embodiments of a method for forming a color filter array and micro-lens structure for imaging system, wherein a micro-lens structure and a sidewall waveguide structure is formed by a same manufacture step and same material.

At 402, a photodetector array is patterned.

At 404, a color filtering array is patterned onto the photodetector array. The color filter elements are patterned separately wherein a space exists between two color filter elements. The color filter elements are patterned so that a ratio of a height of a color filter element to a distance between two color filter elements is about 1:7. The color filter array comprises primary color filter elements arranged in a matrix. The primary colors could be red, green and blue.

At 406, a micro-lens material is applied above the color filter array. In an embodiment, a height of the micro-lens material is larger than a sum of a height and width of the color filter element. The micro-lens material could be coated for example by either spin-on method or deposition.

At 408, a micro-lens shape is patterned above the micro-lens material. Varies methods could be used to pattern micro-lens shape. For example, a photo resist could be exposed, developed and baked to form a rounding shape which will be utilized as micro-lens shape in following steps.

At 410, a back etching is performed to form micro-lens.

One example of FIG. 4's method is now described with regards to a series of cross-sectional views as shown in FIGS. 5-9b. Although FIGS. 5-9b are described in relation to method 400, it will be appreciated that the structures disclosed in FIGS. 5-9b are not limited to such a method, but instead may stand alone as a structure.

Figure 5:
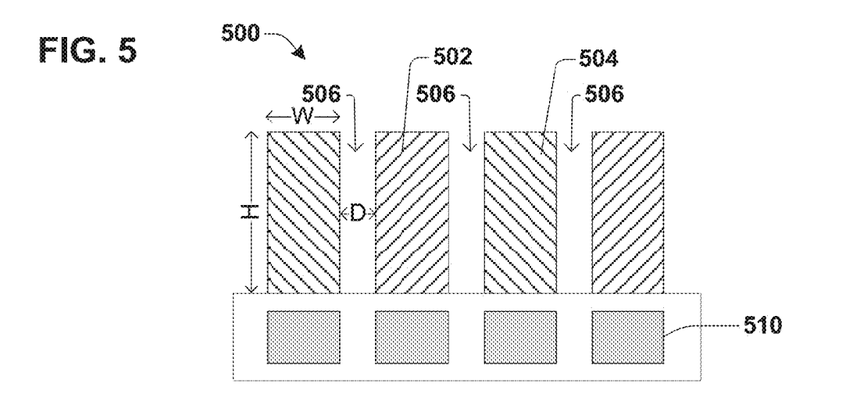
FIGS. 5-8, 9A and 9B illustrate cross-sectional views of some alternative embodiments of a substrate upon which a method of forming a color filter array and micro-lens structure for imaging system is performed.

At FIG. 5, a color filter array 500, which includes color filter elements 502 and 504, is patterned onto the photodetector array 510. The individual color filter elements are aligned with corresponding photodetectors so that a photodetector is covered or overlapped by a color filter element. A color filter element has height H, width W, and the distance between two color filter elements is D (measured from the opposing side walls of two adjacent or neighboring color filter elements). In some embodiments, the value for H is in a range of about 3,000 Å to about 10,000 Å. In some embodiments the value of D is in a range of about 1,500 Å to about 3,000 Å. In some embodiments, the value of W is in a range of about 8000 Å to about 10,000 Å with a pixel pitch about 1.1 µm.

Space 506 exists between neighboring color filter elements 502, 504. In some embodiments, this space 506 extends downward from an upper surface of the color filter elements to the substrate. In some embodiments, this space 506 can be formed by performing an etch when a mask is placed or disposed over the color filter elements. In other embodiments, the color filter elements can be selectively grown over the photodetector array such that the space 506 is a result of the selective growth.

Figure 6:
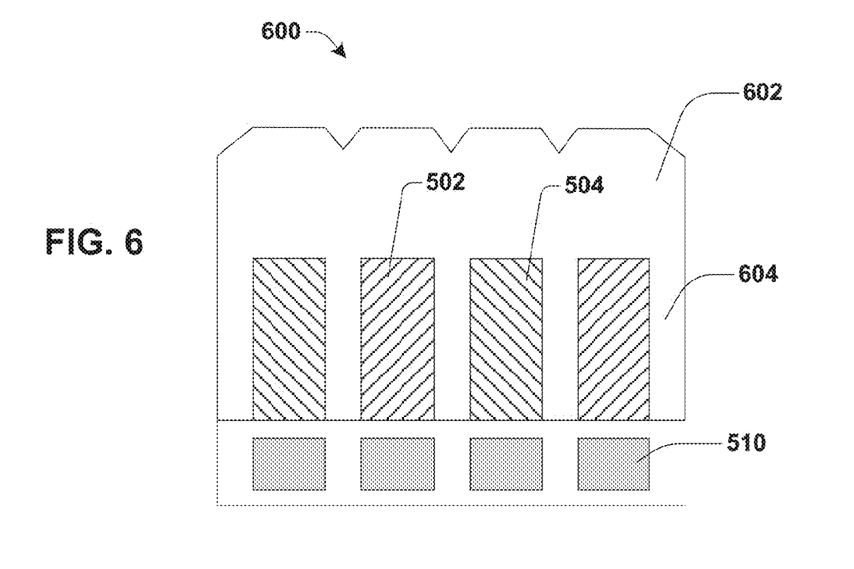

At FIG. 6, a micro-lens material 600 is applied above the color filter array 500 In an embodiment, a height of the micro-lens material is larger than a sum of a height H and width W of the color filter element. The micro-lens material extends downward into the space 506 as shown by 604 to establish sidewall waveguide structures, and also forms over an upper surface of the individual color filter elements as shown by 602.

Figure 7:
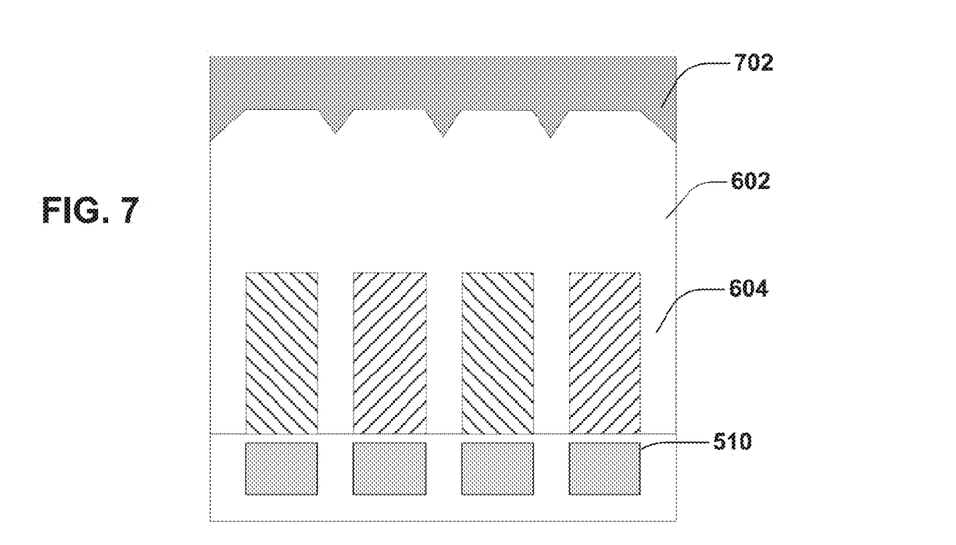

At FIG. 7, a bottom anti-reflection layer 702 is coated above the micro-lens material 602, 604.

Figure 8:
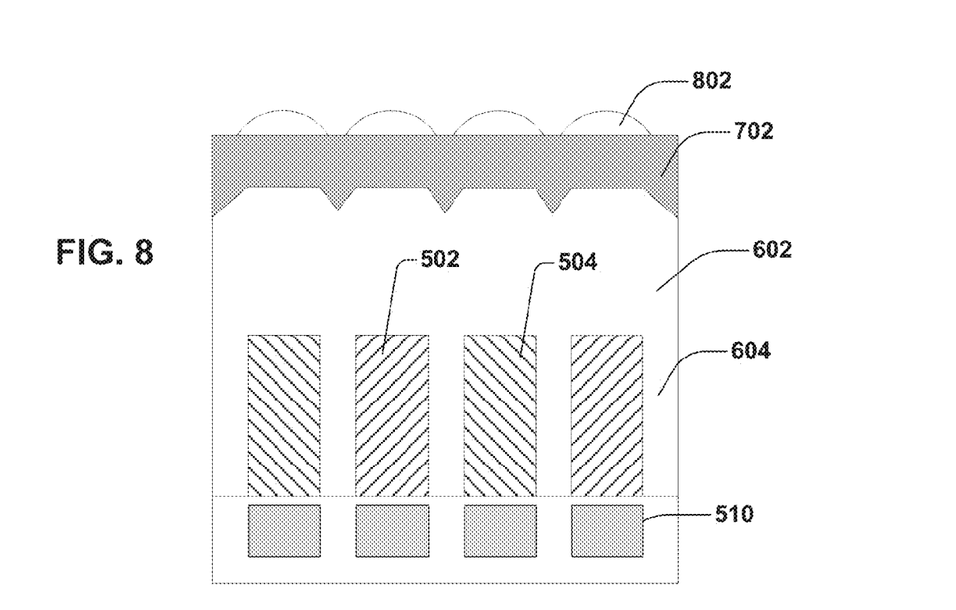

At FIG. 8, a micro-lens template 802 is patterned above the bottom anti-reflection layer with photo resist. The micro-lens template has a curved upper surface whose curvature determines the extent which incident light is to be bent by the micro-lens to be formed. Thus, different curvatures can be used for micro-lens template 802 depending on the wavelengths of incident light that are targeted, as well as the underlying geometries for the color filter elements, sidewall waveguides, and photodetectors. The curved upper surface is applied by distributing exposing light dose to photo resist. For example, the photo resist can be negative material, relative more light is exposed at the bottom of the curvature and relative less light is exposed at the top of the curvature.

Figure 9A:
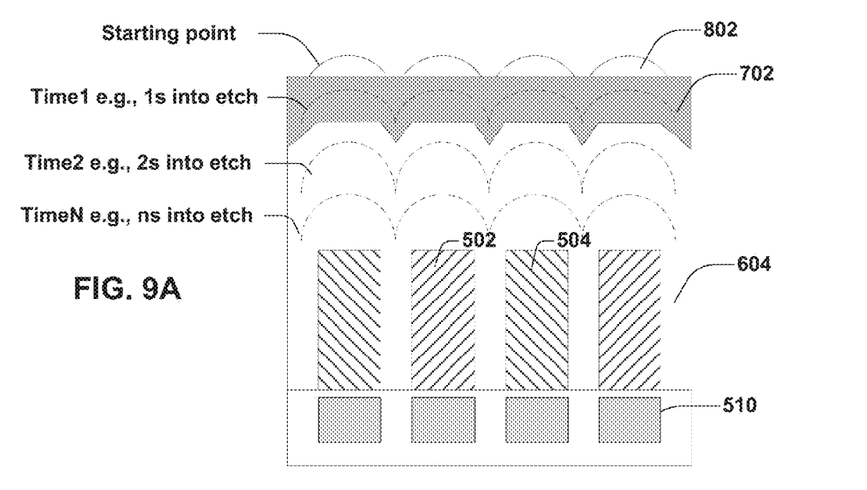
Figure 9B:
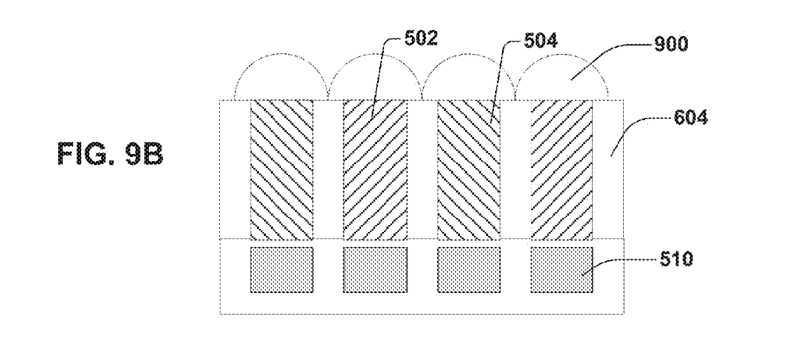

At FIG. 9a and FIG. 9b, a back etching is performed to form micro-lens 900. Notably, the etching chemical used for back etching process is able to etch the photo resist making the micro-lens template as well. Therefore, the portion of the micro-lens material corresponding to bottom of the curvature is etched more than the portion of the micro-lens material corresponding to top of the curvature relatively such that the resultant curvature of the micro-lens 900 substantially follows that of the micro-lens template 802.

Thus, some embodiments relate to a semiconductor device. The device includes a first color filter element on a semiconductor substrate. A second color filter element is formed on the semiconductor substrate and spaced apart from the first color filter element. A micro-lens structure is arranged over a top surface of the first color filter element. A sidewall waveguide structure is arranged between neighboring sidewalls of the first and second color filter elements. The sidewall waveguide structure and micro-lens structure are made of the same material.

Other embodiments relate to a semiconductor imaging system. The semiconductor imaging system includes a photodetector array including a matrix of individual photodetectors. A color filter array is arranged over the photodetector array and includes a matrix of color filter elements which are arranged vertically over respective photodetectors in the photodetector array. An array of micro-lenses are arranged over the color filter array and includes a matrix of micro-lens structures which are arranged vertically over, or overlap, respective color filter elements of the color filter array. A sidewall waveguide structure laterally surrounds a color filter element. The sidewall waveguide structure re-directs incident radiation striking a micro-lens structure with a first angle of incidence, which is less than a predetermined angle of incidence, toward an individual photodetector that corresponds vertically to the color filter element and the micro-lens structure. In an embodiment, the micro-lens structure is configured to focus a first incident ray with an angle of incidence that is less than a predetermined angle of incidence, and a second incident ray with an angle of incidence that is greater than the predetermined angle of incidence, through a color filter element. In another embodiment, the sidewall waveguide structure is configured to reflect the focused first incident ray to strike the photodetector and further configured to refract the focused second incident ray to pass between neighboring photodetectors.

Still another embodiment relates to a method of forming a semiconductor imaging system structure. In this method, a photodetector array is patterned on a semiconductor substrate. A color filter array is patterned over the photodetector array. The color filter array, after being patterned, has spaces between neighboring color filter elements of the color filter array. A micro-lens material is applied to the patterned color filter array. The micro-lens material fills the spaces between neighboring color filter elements to establish sidewall waveguide structures and also covers upper surfaces of the color filter elements to establish micro-lens structures.

It will be appreciated that while reference is made throughout this document to exemplary structures in discussing aspects of methodologies described herein (e.g., the structure presented in FIGS. 5-9b, while discussing the methodology set forth in FIG. 4), that those methodologies are not to be limited by the corresponding structures presented. Rather, the methodologies (and structures) are to be considered independent of one another and able to stand alone and be practiced without regard to any of the particular aspects depicted in the Figures. Additionally, layers described herein, can be formed in any suitable manner, such as with spin on, sputtering, growth and/or deposition techniques, etc.

Also, equivalent alterations and/or modifications may occur to those skilled in the art based upon a reading and/or understanding of the specification and annexed drawings. The disclosure herein includes all such modifications and alterations and is generally not intended to be limited thereby. For example, although the figures provided herein, are illustrated and described to have a particular doping type, it will be appreciated that alternative doping types may be utilized as will be appreciated by one of ordinary skill in the art.

In addition, while a particular feature or aspect may have been disclosed with respect to only one of several implementations, such feature or aspect may be combined with one or more other features and/or aspects of other implementations as may be desired. Furthermore, to the extent that the terms "includes", "having", "has", "with", and/or variants thereof are used herein, such terms are intended to be inclusive in meaning—like "comprising." Also, "exemplary" is merely meant to mean an example, rather than the best. It is also to be appreciated that features, layers and/or elements depicted herein are illustrated with particular dimensions and/or orientations relative to one another for purposes of simplicity and ease of understanding, and that the actual dimensions and/or orientations may differ substantially from that illustrated herein.

What is claimed is:

1. A method of forming a semiconductor imaging system, comprising:
    patterning a photodetector array on a semiconductor substrate;
    patterning a color filter array over the photodetector array; wherein the color filter array, after being patterned, has spaces between neighboring color filter elements of the color filter array;
    applying a micro-lens material to the patterned color filter array; wherein the micro-lens material fills the spaces between neighboring color filter elements to establish sidewall waveguide structures and also covers upper surfaces of the color filter elements to establish convex micro-lens structures;
    forming an anti-reflecting layer over an uneven top surface of the micro-lens material to provide for a planar upper surface;
    forming a micro-lens template over the anti-reflecting layer, the micro-lens template having a predetermined surface curvature corresponding to a desired surface curvature for a convex micro-lens structure; and
    with the micro-lens template in place, etching back the anti-reflecting layer and the micro-lens material to form the convex micro-lens structure having the desired surface curvature;
    wherein the anti-reflecting layer is formed over the uneven top surface of the micro-lens material prior to forming the micro-lens template;
    wherein an upper surface of the convex micro-lens structures has a minimum height at a position that that reaches the sidewall waveguide structures and is coplanar with upper surfaces of the color filter elements as measured from an upper surface of the semiconductor substrate.

2. The method of claim 1, wherein the micro-lens template comprise a photo resist layer.

3. The method of claim 2, wherein an etching chemical used to etch back the micro-lens material etches back the photo resist layer.

4. The method of claim 1, wherein there is not a seam present between the convex micro-lens structures and the sidewall waveguide structures.

5. The method of claim 1, wherein a ratio of a height of a color filter element to a distance between opposing sidewalls of two color filter elements is about 1:7.

6. The method of claim 1, wherein the micro-lens material is photo resist.

7. The method of claim 1, wherein the micro-lens material is silicon dioxide.

8. The method of claim 1, wherein the micro-lens material has a first index of refraction, and the color filter element has a second index of refraction that is greater than the first index of refraction.

9. A method of forming a semiconductor imaging system, comprising:
    forming a photodetector array within a substrate;
    forming a color filter array overlying the photodetector array, the color filter array including a plurality of color filter elements having spaces between one another;
    forming a micro-lens material to fill the spaces between neighboring color filter elements to establish sidewall waveguide structures and to extend over upper surfaces of the color filter elements;
    forming an anti-reflecting layer over an uneven top surface of the micro-lens material to fill gaps of the micro-lens material between the color filter elements and to provide for a planar upper surface;
    forming a micro-lens template over the anti-reflecting layer; and
    etching back the anti-reflecting layer and the micro-lens material to form a convex micro-lens structure overlying the color filter elements;
    wherein an upper surface of the convex micro-lens structure has a minimum height at a position that reaches the sidewall waveguide structures and is coplanar with upper surfaces of the color filter elements as measured from bottom surfaces of the color filter elements.

10. The method of claim 9, wherein the micro-lens template has a predetermined surface curvature corresponding to a desired surface curvature for the convex micro-lens structure.

11. The method of claim 10, wherein the micro-lens template is formed to have a plurality of separate convex templates respectively overlying the plurality of color filter elements within the micro-lens material.

12. The method of claim 9, wherein the convex micro-lens structure is formed to have a plurality of micro-lenses respectively overlying the plurality of color filter elements, wherein the position where the upper surface of the convex micro-lens structure has the minimum height is arranged equidistantly between outer sidewalls of the sidewall waveguide structure as measured from an upper surface of the substrate.

13. The method of claim 9, wherein the convex micro-lens structure and the waveguide structures have the same composition and wherein there is not a seam presents between the convex micro-lens structure and the sidewall waveguide structures.

14. The method of claim 9, wherein a ratio of a height of a color filter element to a distance between opposing sidewalls of two color filter elements is about 1:7.

15. The method of claim 9, wherein a photo resist layer is exposed and developed over the micro-lens material to form a convex curvature.

16. The method of claim 9, wherein the micro-lens material has an index of refraction smaller than 1.8.

17. A method of forming a semiconductor imaging system, comprising:
    forming a p-n junction photodetector array within a semiconductor substrate;
    forming a color filter array overlying the photodetector array, the color filter array including a plurality of color filter elements spaced apart one from another;

forming a micro-lens material to fill spaces between neighboring color filter elements and to extend over upper surfaces of the color filter elements;

forming an anti-reflecting layer over an uneven top surface of the micro-lens material, the anti-reflecting layer having a planar upper surface;

forming a micro-lens template over the anti-reflecting layer, the micro-lens template having a predetermined convex surface curvature; and etching back the anti-reflecting layer and the micro-lens material to form a convex micro-lens structure overlying the color filter elements;

wherein an upper surface of the convex micro-lens structure has a minimum height at a position that reaches sidewall waveguide structures and is coplanar with upper surfaces of the color filter elements as measured from an upper surface of the semiconductor substrate.

18. The method of claim 1, wherein the micro-lens template is formed on the anti-reflecting layer as a plurality of discrete convex structures that are spaced from one another.

19. The method of claim 17, wherein the micro-lens template is formed to have a plurality of separate convex templates respectively overlying the plurality of color filter elements within the micro-lens material.

20. The method of claim 17, wherein the micro-lens material has a first index of refraction, and the color filter element has a second index of refraction that is greater than the first index of refraction.

* * * * *